United States Patent [19]

Young

[11] Patent Number: 5,303,707
[45] Date of Patent: Apr. 19, 1994

[54] MAGNETIC RESONANCE METHODS AND APPARATUS

[75] Inventor: Ian R. Young, Marlborough, England

[73] Assignee: Picker International, Ltd., Chelmsford, United Kingdom

[21] Appl. No.: 966,350

[22] Filed: Oct. 26, 1992

[30] Foreign Application Priority Data

Nov. 8, 1991 [GB] United Kingdom ............... 9123745

[51] Int. Cl.$^5$ ................................ A61B 5/055
[52] U.S. Cl. ................... 128/653.2; 128/653.5; 324/309; 324/318; 324/322
[58] Field of Search .................... 128/653.2, 653.5; 324/318, 322, 309

[56] References Cited

U.S. PATENT DOCUMENTS

| | | |
|---|---|---|
| 4,572,198 | 2/1986 | Codrington . |
| 4,672,972 | 6/1987 | Berke .............................. 128/653.5 |
| 4,932,411 | 6/1990 | Fritschy et al. ................. 128/653.2 |
| 4,960,106 | 10/1990 | Kubokawa et al. . |
| 5,050,607 | 9/1991 | Bradley et al. .................. 128/653.2 |

FOREIGN PATENT DOCUMENTS 0385367  9/1990  European Pat. Off. ......... 128/653.5

Primary Examiner—Ruth S. Smith
Attorney, Agent, or Firm—Timothy B. Gurin

[57] ABSTRACT

A magnetic resonance method and apparatus for the microscopic examination of an internal region of a body (3) wherein a probe (25) is located in the body adjacent the region during the examination, and spatial encoding of r.f. signals resulting for excitation of magnetic resonance in the region is effected by a magnetic field gradient produced in the region by a coil arrangement carried by the probe.

20 Claims, 4 Drawing Sheets

MAGNETIC RESONANCE METHODS AND APPARATUS

FIELD OF THE INVENTION

This invention relates to magnetic resonance methods and apparatus.

More particularly the invention relates to magnetic resonance methods and apparatus for the microscopic examination of an internal region of a body, for example, an internal region of the body of a live human patient for medical purposes.

BACKGROUND OF THE INVENTION

In magnetic resonance methods for examining the body of a live human patient for medical purposes, e.g. to obtain image and/or spectroscopic data, the body under investigation is placed in a static magnetic field to define an equilibrium axis of magnetic alignment in the region of the body being examined. A radio frequency (r.f.) magnetic field is then applied to the region being examined in a direction orthogonal to the static magnetic field direction to excite magnetic resonance in material, typically in hydrogen protons, in the region, and the resulting r.f. signals are detected and analysed. During this sequence of operations one or more gradients are normally imposed on the static magnetic field to cause excitation of magnetic resonance preferentially in the region of the body to be examined, to encode spatially the detected r.f. signals, and also for other purposes such as flow encoding.

When microscopic examination of a very small internal region of a body is required, to improve signal-to-noise ratio detection of the r.f. signal is carried out by means of one or more electric coils carried on a probe inserted into the body so as to lie adjacent the region of interest. To obtain high, e.g. 1 micron, resolution in the region of interest, relatively steep magnetic gradients must be applied across the region of interest for spatial encoding purposes etc. In addition, since water molecules in most human tissues have a relatively high diffusion coefficient such that water molecules in the tissue will typically move a distance of about 8 microns in 10 milliseconds, collection of data must be effected rapidly making even steeper magnetic field gradients desirable. The application of sufficiently steep magnetic fields by the kinds of coil arrangements conventionally used in magnetic resonance apparatus and methods has proved very difficult.

SUMMARY OF THE INVENTION

It is an object of the present invention to provide a magnetic resonance method and apparatus wherein this problem is alleviated.

In accordance with one aspect of the present invention there is provided a magnetic resonance apparatus suitable for the microscopic examination of an internal region of a body including a probe adapted to be located in said body adjacent said region during an examination, and an electric coil arrangement carried on said probe and arranged to produce, when energised, a magnetic gradient field in said region which serves to spatially encode r.f. signals resulting from excitation of magnetic resonance in said region during the examination.

In an apparatus according to the invention said electric coil arrangement is suitably of a form such that said magnetic gradient field is produced in a region adjacent an edge of a volume embraced by the coil arrangement. Normally the volume embraced by the coil arrangement will be a portion of the volume of the probe.

In one particular apparatus according to the invention the probe is cylindrical and the coil arrangement produces a magnetic gradient field with a field direction substantially orthogonal to a main axis of the probe in a region to one side of the probe.

In another particular apparatus according to the invention the probe is cylindrical and the coil arrangement produces a magnetic gradient field with a field direction substantially parallel to a main axis of the probe in a region to one side of the probe.

In an apparatus according to the invention the probe preferably also carries a coil arrangement for detecting r.f. signals resulting from excitation of magnetic resonance in said region, which coil arrangement may be separate from, or form part of the coil arrangement for producing a magnetic gradient field.

In accordance with a second aspect of the invention there is provided a magnetic resonance method for examining an internal region of a body including the steps of locating a probe in said body adjacent said region and applying a magnetic gradient field to said region using a coil arrangement carried on said probe to spatially encode r.f. signals resulting from excitation of magnetic resonance in said region.

BRIEF DESCRIPTION OF THE DRAWINGS

One magnetic resonance apparatus and method in accordance with the invention will now be described, by way of example, with reference to the accompanying drawings in which.

DETAILED DESCRIPTION OF THE INVENTION

Figure 1:
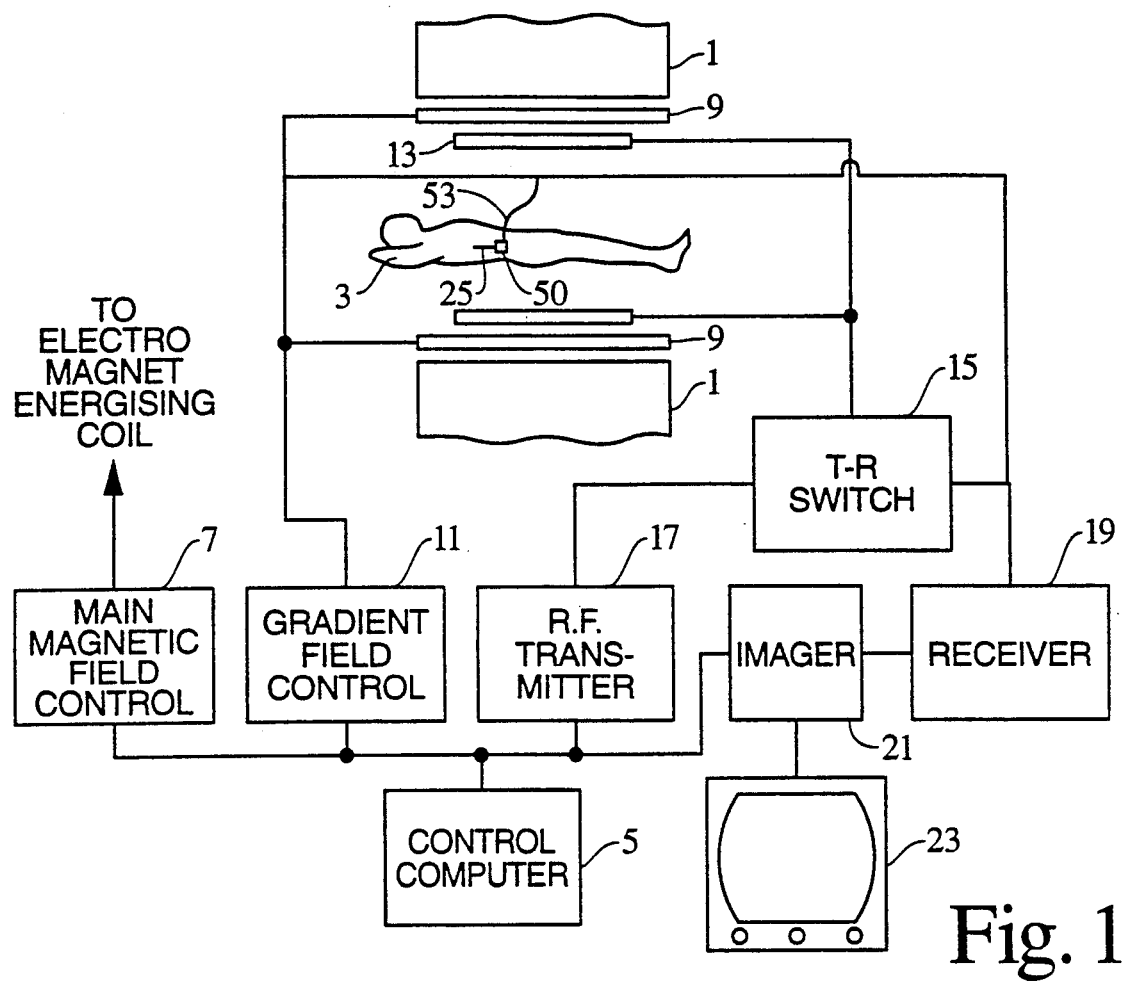
FIG. 1 is a schematic diagram of the apparatus.

Referring to FIG. 1, the apparatus, which is a diagnostic patient imaging apparatus, includes an electromagnet which produces a strong uniform static magnetic field Bo across a gap between two pole pieces 1 of a magnetic core arrangement of the electromagnet, the pole pieces 1 being joined by a yoke (not shown) carrying an energising coil (not shown). In use of the apparatus a patient 3 to be imaged is placed in the gap between the pole pieces on a suitable support (not shown) so that the head-to-toe axis of the patient is orthogonal to the direction of the magnetic field Bo in the gap between the pole pieces.

The strength of the field in the gap between the pole pieces 1, and hence in the patient 3, is controlled by a computer 5 via a main magnet control 7 which controls the supply of energising current to the electromagnetic energising coil.

The apparatus further includes a gradient coil system 9 whereby a gradient may be imposed on the static magnetic field in the gap between the pole pieces 1 in any one or more of three orthogonal directions x, y and z. The coil system 9 is energised by a gradient field control 11 under control of the computer 5.

The apparatus further includes an r.f. antenna system 13. The antenna system 13 is selectively connectable by way of a transmit-receive switch 15 either to an r.f. transmitter 17 or a receiver 19. The transmitter 17 is operated under control of the computer 5 to apply r.f. field pulses to the patient 3 for excitation of magnetic resonance in the patient 3. For examinations of relatively large parts of the patient r.f. signals resulting from magnetic resonance excited in the body are sensed by the antenna system 13 and passed via the receiver 19 to an imager 21 which under control of the computer 5 processes the signals to produce signals representing an image of the patient 3. These signals are, in turn, passed to a display device 23 to provide a visual display of the image. Instead of using a T-R switch the antenna system 13 may comprise separate transmitting and receiving coil arrangements respectively connected with transmitter 17 and receiver 19.

For microscopy examinations of an internal region of the body of the patient 3 signals resulting from magnetic resonance excited in the region under examination are detected by a coil arrangement carried on a probe 25, as further described below, which is inserted into the patient's body, normally via a naturally occurring channel, so as to lie closely adjacent the region of interest. In addition, the gradients imposed on the static magnetic field Bo by the coil system 9 are augmented by magnetic fields produced by the coil arrangement carried on the probe 25.

In operation of the apparatus the field provided by the electromagnet defines an equilibrium axis of magnetic alignment in the region of interest of the patient 3.

To obtain an image of a selected region of the patient's body, an r.f. field pulse is first applied to the body by means of the r.f. transmitter 17 and antenna system 13 to excite magnetic resonance in the selected region. To this end the antenna system 13 produces a field B1 in a direction orthogonal to the static field direction so as to tip the spins of nuclei in the selected region from the direction of the static field into a plane orthogonal to the static field direction. To restrict excitation to the selected region the r.f. field pulse is applied in conjunction with magnetic field gradients imposed by the coil system 9 or, for microscopy examinations, the coil system 9 together with the coil arrangement on the probe 25, the frequency of the r.f. field being chosen in conjunction with the magnitudes and directions of the imposed gradients so that the Larmor frequency of chosen protons in the body, e.g. hydrogen protons, is equal to the r.f. field frequency only in the selected region.

The r.f. signals resulting from excitation are then spatially encoded by application of one or more further gradient magnetic fields, detected by the antenna system 13 or, for microscopy examinations, by the coil arrangements carried by the probe 25, and processed to produce an image.

Normally a number of excitation and signal detection sequences are required to produce sufficient data to produce a satisfactory image.

Figures 2, 3:
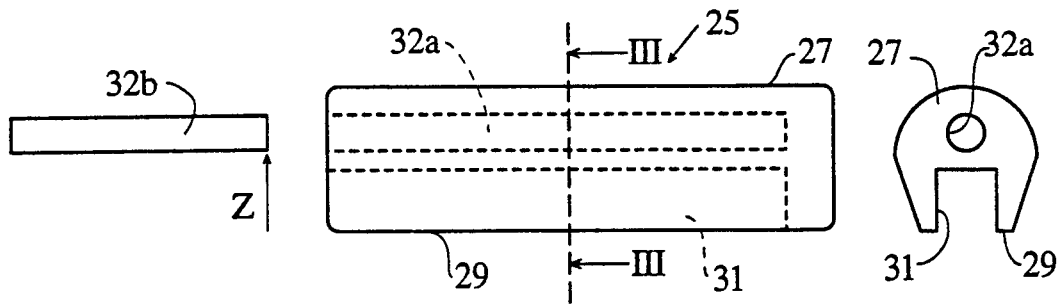
FIG. 2 is a diagrammatic side view of a probe for use in the apparatus of FIG. 1.
FIG. 3 is a sectional view along line III—III in FIG. 2.

Referring to FIGS. 2 and 3 the probe 25 has a cylindrical main body 27 made of an electrically insulating biologically inactive material, such as glass, the diameter of the body 27 being not greater than 5 mm, suitably about 2.5 mm, and its length being typically about 25 mm. The body 27 is of circular cross section but with a flat 29 extending axially along its length. An axially extending channel 31 of rectangular cross section extends into the body 27 from the flat 29, the channel accommodating a cylindrical glass bobbin 33 (described below) of generally square cross-section which carries the coil arrangement of the probe 25. An axial bore 32a extending alongside the channel 31 accommodates a metal slug 32b, suitably of silver, which serves to carry away heat generated in the coil arrangement in operation.

In operation the probe 25 is positioned with its main i.e. longitudinal, axis approximately in the plane orthogonal to the direction of the static magnetic field Bo, normally designated the z-direction. The probe 25 is designed to detect excited magnetic spins, i.e. nuclear spins in the x-y plane, in a selected region within a generally rectangular volume lying adjacent one side of the probe 25, near one end of the probe 25, which volume is indicated by chain-dotted line 35 in FIG. 4.

Figure 4:
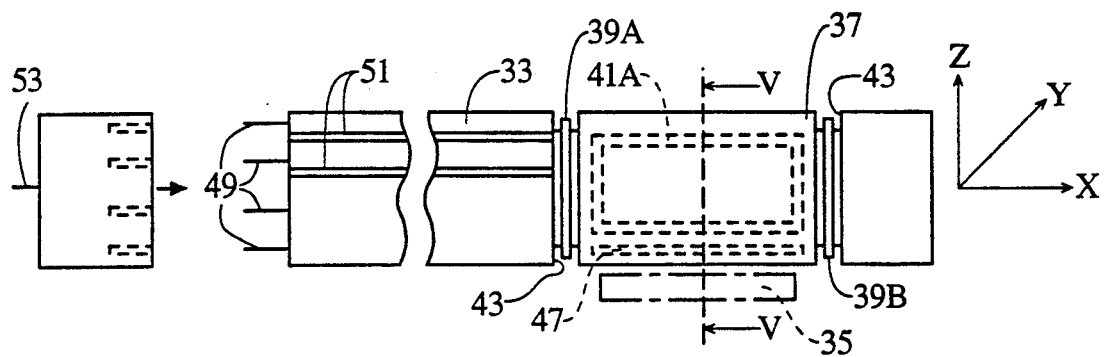
FIG. 4 is a diagrammatic side view of one form of coil arrangement for the probe of FIGS. 2 and 3.
Figure 5:
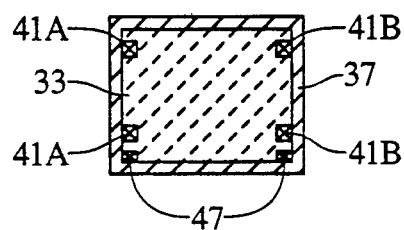
FIG. 5 is a sectional view on the line V—V in FIG. 4.

Referring now to FIGS. 4 and 5, for the detection of spins the bobbin 33 carries a helical r.f. coil 37 coaxial with the bobbin 33. For the imposition of x and y direction gradients on the z-direction static field Bo within the volume 35 the bobbin 33 carries two Helmholtz coil pairs 39A, B and 41A, B. A Helmholtz coil pair comprises two identical coils which are close wound, in the same sense, positioned in coaxial spaced relationship, and connected for energisation in series.

Figure 6:
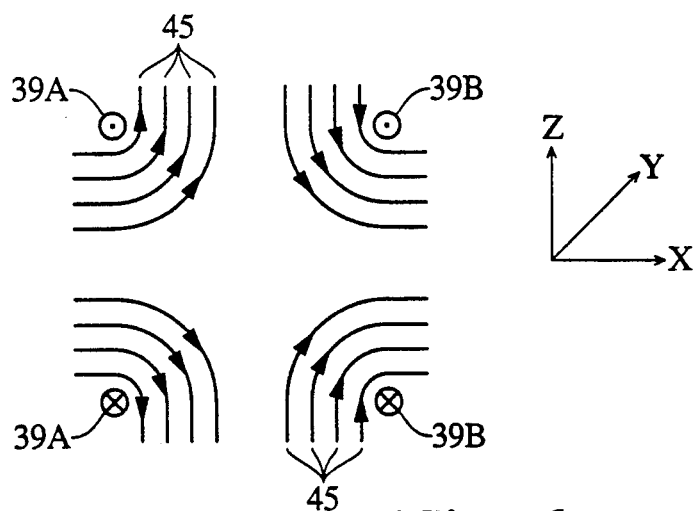
FIG. 6 is a diagram illustrating a magnetic field produced by the coil arrangement of FIGS. 4 and 5.

The two coils 39 of one Helmholtz pair impose a gradient in the direction of the axis of the probe 25, i.e. in the x-direction with the probe orientated as shown in FIG. 4. The coils 39A, B are positioned respectively in two peripheral grooves 43 formed in the outer surface of the bobbin 33, one at each end of the r.f. coil 37. The coils 39A, B are thus coaxial with the bobbin 33 and when energised produce in the volume 35, i.e. in a region to one side of the volume embraced by the pair of coils 39A, B a z-direction magnetic field whose strength varies in the x-direction from a maximum in one sense near one coil 39A through zero midway between the coils 39A, B to a maximum in the opposite sense near the other coil 39B. This is illustrated diagrammatically in FIG. 6 where the flux produced when the coils 39 are energised is indicated by lines 45.

The other pair of coils 41A, B are positioned in recesses on opposite sides of the bobbin 33 inside the r.f. coil 37 and between the coils 39, i.e. with their axes aligned and orthogonal to the axis of the bobbin 33, and hence to the axes of the coils 39. Thus, when energised, the coils 41A, B produce in the volume 35 a z-direction magnetic field having a gradient orthogonal to the gradient produced by coils 39, i.e. in the y-direction in FIG. 4.

To impose a z-direction gradient on the static magnetic field Bo in the volume 35 the bobbin 33 carries a coil 47 mounted with its axis orthogonal to the axes of coils 39 and coils 41 and on the same side of the bobbin 33 as the volume 35, inside the r.f. coil 37.

If desired, the bobbin 33 may alternatively or additionally carry a helical r.f. coil (not shown) coaxial with the coils 41. It will be appreciated that the bobbin 33 must then be made in three sections the centre section of which carries the coil arrangement.

Leads to and from the various coils carried by the bobbin 33 are brought out to pins 49 at one end of the bobbin 33 via channels 51 extending longitudinal along the outer surface of the bobbin 33.

The pins 49 are adapted to mate with a socket 50 at one end of a lead 53 (see FIG. 1) whereby the r.f. coil 37 is connected to the receiver 19 and the gradient coils 39, 41 and 47 are connected with the gradient field control 11.

In an alternative form of coil arrangement for the probe 25 on of the coils is used both for imposing magnetic field gradients in the x and/or y direction and for r.f. signal detection.

Figure 7:
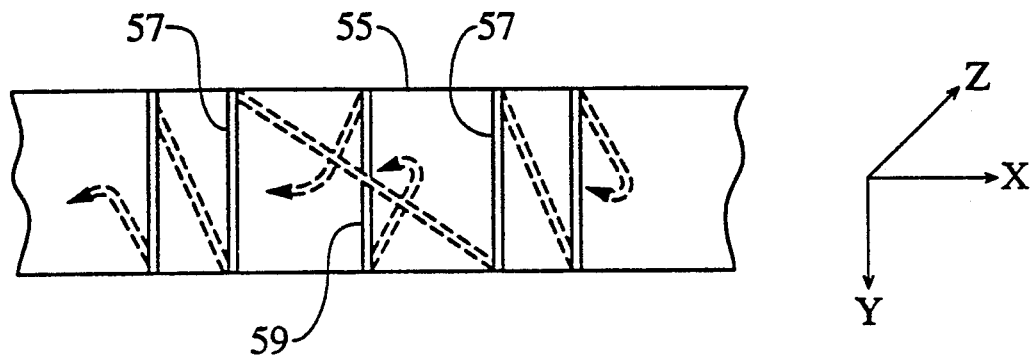
FIG. 7 is a diagrammatic side view of an alternative form of coil arrangement for the probe of FIGS. 2 and 3.

One such arrangement is shown in FIG. 7 which depicts a coil arrangement for imposing a gradient in the direction of the axis of the probe 25 i.e. in the x direction in FIG. 7, viewed from the region to be examined. In this arrangement a bobbin 55 for insertion in the channel 31 of the probe body 27 carries a first coil 57 having four helically wound coaxial spaced turns and a second coil 59 having a single turn wound coaxially with but in the opposite sense to the turns of the first coil 57 and positioned between the middle two turns of the first coil 57. In addition the single turn of coil 59 is spaced from the adjacent turns of coil 57 by twice the spacing of the first two turns of coil 57 and the last two turns of coil 57. Leads to the coils 57 and 59 pass along channels (not shown) in the outer surface of the bobbin 55 to pins (not shown) at one end of the bobbin 55.

In operation a current is passed through the two coils 57, 59 in series so that the coil 59 produces a flux opposing that produced by coil 57. As a result a magnetic field is produced in the z-direction adjacent the outside face of the bobbin 55, i.e. in a volume corresponding to volume 35 in FIG. 4, which is of zero strength in the plane of the coil 59 and increases in one sense for a short distance in one direction parallel to the bobbin axis and in the other sense in the opposite direction. Thus a z-direction field is produced by the coils 57, 59, in the region just outside the volume embraced by the coils 57, 59, which has an x-direction gradient adjacent the coil 59.

For detecting r.f. signals the coil 57 alone is used, the coil 59 being effectively disabled in respect of radio frequency signals.

Figure 8:
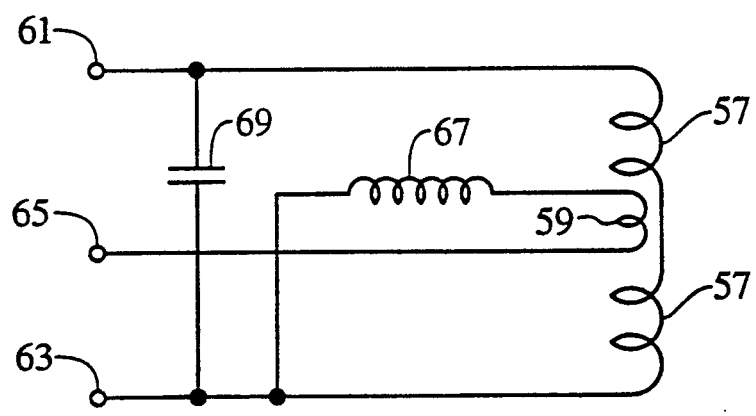
FIG. 8 is a circuit diagram illustrating a method of connection of the coil arrangement of FIG. 7.

A suitable method of connecting the coils 57, 59 is illustrated in FIG. 8. In this arrangement the ends of coil 57 are connected to terminals 61 and 63 respectively, one end of coil 59 is connected to a third terminal 65 and the other end of coil 59 is connected to terminal 63 via an inductor 67. A capacitor 69 is connected between terminals 61 and 63. The gradient magnetic field is produced by an input signal applied between terminals 61 and 65 which thus produces currents in opposite directions in coils 57 and 59. The r.f. signals picked up by coil 57 appears between terminals 61 and 63, the inductor 67 providing a high impedance to r.f. signals. The capacitor 69 serves to tune the coil 57 to the frequency of the r.f. signals.

The bobbin 55 will normally carry a second coil arrangement (not shown), outside or inside the first coil arrangement 57, 59 and similar to the coil arrangement 57, 59 but having its axis orthogonal to the axis of the coil arrangement 57, 59. This enables a y-direction gradient to be imposed on the z-direction field in the region under examination. This second coil arrangement, of course, can also be used to detect the r.f. signal which, if the two coil arrangements are wound in appropriate relative sense, can be added to the r.f. signal detected by the other coil arrangement.

The bobbin 55 may also, of course, if desired, carry a further coil arrangement to impose a z-direction gradient on the field in the region under examination. This further coil arrangement suitably comprises a single coil positioned as coil 47 of the probe coil arrangement described above with reference to FIGS. 4 and 5.

As mentioned above, the gradient field produced by the probe 25 can be used to augment the gradients produced by the gradient coil system 9 external of the patient's body 3. In this way the field strength in the region under examination can be made different from that elsewhere in the patient's body and so avoid aliasing and pick-up of unwanted r.f. signals from outside the region under examination. However, if desired the probe coil arrangement may be used alone to provide the magnetic gradient fields used during data collection sequences.

Whilst the probe 25 as described above in relation to FIGS. 4 to 8 is designed for use in a position with its longitudinal axis approximately orthogonal to the direction of the static magnetic field $B_o$, i.e. the z-direction, and the probe coil arrangements described with reference to FIGS. 4 to 8 therefore produce magnetic gradient fields in the region 35 in a direction orthogonal to the longitudinal axis of the probe 25, in other arrangements in accordance with the invention the probe 25 may be designed for use in a position with its longitudinal axis approximately parallel to the static magnetic field direction. Examples of magnetic gradient field coil arrangements for use with such a probe, i.e. which produce gradient fields in the region 35 directed parallel to the longitudinal axis of the probe, are described below.

Figure 9:
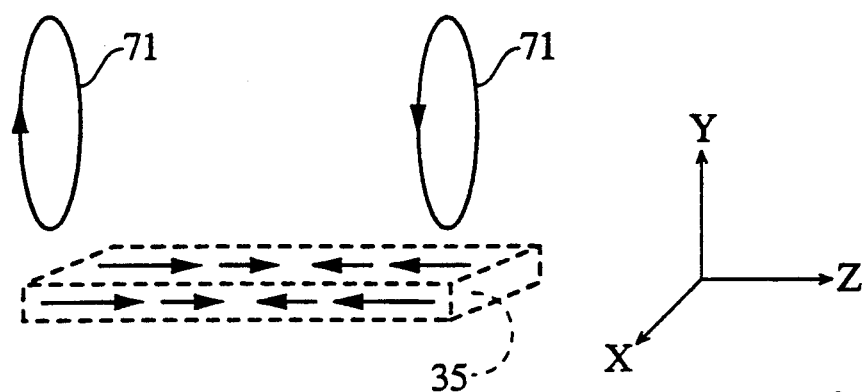
FIGS. 9, 10 and 11 are diagrams illustrating further alternative forms of coil arrangement for the probe of FIGS. 2 and 3.

Referring to FIG. 9, to produce a field in the direction of the probe axis, i.e. the z-direction, with a gradient in the z-direction a pair of identical coils 71 positioned in coaxial spaced relationship with their axes parallel to the probe main axis, i.e. the z-direction, and energised to produce oppositely directed magnetic fields (indicated by arrows) may be used.

Figure 10:
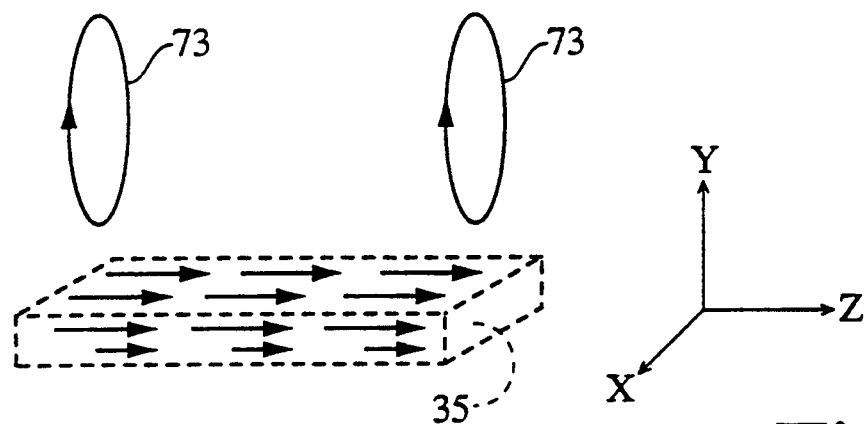

Referring to FIG. 10, to produce a field in the direction of the probe axis with a gradient orthogonal to the z-direction a similar coil arrangement to that used for a z-direction gradient but with the coils 73 energised to produce correspondingly directed fields may be used.

Figure 11:
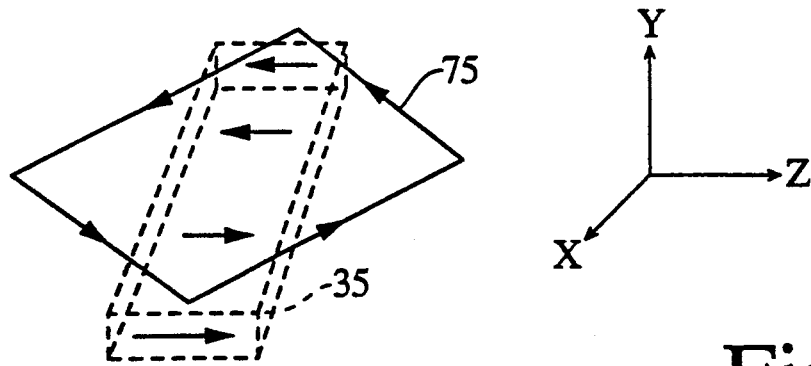

Referring to FIG. 11 to produce a field in the direction of the probe axis with a gradient in a particular direction orthogonal to the probe axis e.g. the x-direction, a single coil 75 whose axis is orthogonal to the desired gradient direction may be used.

The coil 75 is suitably of quadrilateral form, e.g. square or diamond shaped, rather than circular, and sited in a groove (not shown) formed in the surface of the probe body or bobbin.

It will be understood that whilst the coil arrangements of FIGS. 10 and 11 comprise coils similar to coils 39A, 39B and 47 of FIG. 4 above, they can be used to produce differently directed field and gradients by appropriate selection of the position and size of the coils relative to the region 35 and the magnitude of the energising current for the coils.

It will be appreciated that if, as will normally be the case, a probe intended for use with its main axis parallel to the static field direction is also required to carry a coil arrangement for detecting r.f. signals, the coil or coils of such arrangement will require to be wound so that its axis is orthogonal to the probe main axis. It will be appreciated that the coil 75 shown in FIG. 11 may thus be suitably used for r.f. detection as well as producing a magnetic field gradient.

I claim:

1. A magnetic resonance apparatus suitable for the microscopic examination of an internal region of a body including:
   means for generating a static magnetic field in the region;
   means for applying r.f. signals to the region to excite magnetic resonance therein;
   means for imposing a gradient magnetic field in said region, said gradient magnetic field imposing means including;
      a probe adapted to be located in said body adjacent said region during an examination;
      an electric coil arrangement carried on said probe for location in the body adjacent said region, said coil arrangement comprising a coaxially spaced coil pair; and
      a gradient field controller connected to the electrical coil arrangement for energizing said coil arrangement to produce a magnetic gradient field in said region which serves to spatially encode r.f. signals resulting from excitation of magnetic resonance in said region;
   means for detecting r.f. magnetic resonance signals emanating from the region;
   means for processing the received r.f. signals into image signals representative of the region; and
   means for visually displaying the image signals.

2. An apparatus according to claim 1 wherein the common axis of the coil pair is disposed one of parallel and orthogonal to the longitudinal axis of the probe for producing said magnetic gradient field in a region adjacent an edge of a volume embraced by the coil arrangement.

3. An apparatus according to claim 2 wherein said volume embraced by the coil arrangement is a portion of the volume of the probe.

4. An apparatus according to claim 1 wherein the probe is cylindrical and the coil arrangement produces said magnetic gradient field with a field direction substantially orthogonal to a main axis of the probe in a region to one side of the probe.

5. An apparatus according to claim 1 wherein the probe is cylindrical and the coil arrangement produces said magnetic gradient field with a field direction substantially parallel to a main axis of the probe in a region to one side of the probe.

6. An apparatus according to claim 1 wherein the probe is cylindrical and the axis of said coil pair is parallel to a main axis of the probe.

7. An apparatus according to claim 1 wherein the probe is cylindrical and the axis of the coil pair is orthogonal to a main axis of the probe.

8. An apparatus according to claim 1 wherein said coaxially spaced coil pair comprises a first coil comprising an even number of helically wound coaxial spaced turns and a second coil coaxial with the first coil and positioned between the middle two turns of the first coil, the first and second coils being wound in opposites senses and connected in series for producing opposing fluxes when energized by the gradient field controller.

9. An apparatus according to claim 8 wherein said second coil comprises a single turn.

10. An apparatus according to claim 9 wherein said first coil comprises four turns.

11. An apparatus according to claim 8 wherein the probe is cylindrical and the axes of said first and second coils are parallel to a main axis of the probe.

12. An apparatus according to claim 8 wherein the probe is cylindrical and the axes of said first and second coils are orthogonal to a main axis of the probe.

13. An apparatus according to claim 1 wherein said probe further comprises a coil arrangement for detecting r.f. signals resulting from excitation of magnetic resonance in said region.

14. An apparatus according to claim 13 wherein said coil arrangement for detecting r.f. signals comprises at least one helically wound coil separate from said coil arrangement for producing a magnetic gradient field.

15. An apparatus according to claim 13 wherein said coil arrangement for detecting r.f. signals comprises part of said coil arrangement for producing a magnetic gradient field.

16. An apparatus according to claim 1 wherein said probe comprises a body portion of generally cylindrical form and the coil arrangement is carried on a bobbin accommodated in a channel extending axially along the body portion.

17. An apparatus according to claim 16 wherein said body portion and bobbin are formed of an electrically insulating non-magnetic material.

18. An apparatus according to claim 17 wherein said material is glass.

19. An apparatus according to claim 17 wherein said probe includes a slug of heat conductive material housed in a bore extending alongside the channel.

20. A magnetic resonance method for examining an internal region of a body, said method including the steps of:
   locating a probe in said body adjacent said region;
   generating a static magnetic field in said region;
   applying r.f. signals to the region; to excite magnetic resonance in the region
   applying a magnetic gradient field to said region using a coil arrangement carried on said probe to spatially encode r.f. signals resulting from excitation of magnetic resonance in said region;
   detecting r.f. magnetic resonance signals emanating from the region;
   processing the received magnetic resonance signals into image signals; and
   visually displaying the image signals on an image monitor.

* * * * *